(12) United States Patent
Schmidt

(10) Patent No.: US 10,698,035 B2
(45) Date of Patent: Jun. 30, 2020

(54) CIRCUIT ARRANGEMENT AND METHOD FOR DETERMINING THE IMPEDANCE OF A TEST BATTERY

(71) Applicant: Bayerische Motoren Werke Aktiengesellschaft, Munich (DE)

(72) Inventor: Jan Philipp Schmidt, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 261 days.

(21) Appl. No.: 15/584,091

(22) Filed: May 2, 2017

(65) Prior Publication Data

US 2017/0234935 A1     Aug. 17, 2017

Related U.S. Application Data

(63) Continuation of application No. PCT/EP2015/075204, filed on Oct. 30, 2015.

(30) Foreign Application Priority Data

Nov. 3, 2014  (DE) .......................... 10 2014 222 371

(51) Int. Cl.
*G01R 31/389*     (2019.01)
*G01R 31/3835*    (2019.01)

(52) U.S. Cl.
CPC ....... *G01R 31/389* (2019.01); *G01R 31/3835* (2019.01)

(58) Field of Classification Search
CPC .. G01R 31/389; G01R 31/3835; G01R 31/36; G01R 31/392
See application file for complete search history.

(56) References Cited

U.S. PATENT DOCUMENTS 3,753,094 A    8/1973 Furuishi et al.
6,546,063 B1   4/2003 Lee et al.
(Continued)

FOREIGN PATENT DOCUMENTS

DE    101 53 884 A1    7/2002
JP    2012-163510 A    8/2012
(Continued)

OTHER PUBLICATIONS

German Search Report issued in counterpart German Application DE 10 2014 222 371.7 dated Oct. 30, 2015 with partial English translation (fourteen (14) pages).

(Continued)

*Primary Examiner* — Amy He
(74) *Attorney, Agent, or Firm* — Crowell & Moring LLP

(57) ABSTRACT

A circuit arrangement is provided for determining the impedance of a test battery having a first test battery pole of a first polarity and a second test battery pole of a second polarity. The circuit includes a first test connection for connecting the first test battery pole and a second test connection for connecting the second test battery pole, an AC source which is connected to the test connections and by which an alternating current can be applied to the test battery in the connected state, and a voltage detection device which is connected in parallel to the test connections and to the AC source and by which a voltage profile between the test connections can be detected. The voltage detection device has a voltage measurement unit for measuring a voltage profile between two measurement connections of the voltage measurement unit, and a compensation voltage source which is connected in series to the voltage measurement unit, delivers direct current voltage and has a first pole of the first polarity and a second pole of the second polarity. The first pole is connected to the first test connection, the second pole (Continued)

is connected to the first measurement connection and the second measurement connection is connected to the second test connection.

7 Claims, 2 Drawing Sheets

(56) References Cited

U.S. PATENT DOCUMENTS

2001/0028238 A1 10/2001 Nakamura et al.
2015/0198675 A1 7/2015 Hebiguchi

FOREIGN PATENT DOCUMENTS

WO  WO 2012/088555 A1  7/2012
WO  WO 2014/073208 A1  5/2014

OTHER PUBLICATIONS

International Search Report (PCT/ISA/210) issued in PCT Application No. PCT/EP2015/075204 dated Apr. 6, 2017 with English translation (seven (7) pages).
German-language Written Opinion (PCT/ISA/237) issued in PCT/EP2015/075204 dated Apr. 6, 2017 (five (5) pages).

CIRCUIT ARRANGEMENT AND METHOD FOR DETERMINING THE IMPEDANCE OF A TEST BATTERY

CROSS REFERENCE TO RELATED APPLICATIONS

This application is a continuation of PCT International Application No. PCT/EP2015/075204, filed Oct. 30, 2015, which claims priority under 35 U.S.C. § 119 from German Patent Application No. 10 2014 222 371.7, filed Nov. 3, 2014, the entire disclosures of which are herein expressly incorporated by reference.

BACKGROUND AND SUMMARY OF THE INVENTION

The invention relates to a circuit arrangement for determining the impedance of a test battery having a first test battery pole of a first polarity and a second test battery pole of a second polarity. The circuit arrangement includes a first test connection for connecting the first test battery pole and a second test connection for connecting the second test battery pole, an AC source which is connected to the test connections and can be used to apply an alternating current to the test battery in the connected state, and a voltage recording device which is connected in parallel with the test connections and the AC source and can be used to record a voltage profile between the test connections.

The invention also relates to a method for determining the impedance of a test battery having a first test battery pole of a first polarity and a second test battery pole of a second polarity. The method includes the steps of:

a) applying an alternating current to the test battery by way of an AC source connected to its test battery poles, with the result that an accordingly modulated voltage results at the test battery poles, b) recording the profile of the resulting voltage by way of a voltage recording device which is connected to the test battery poles of the test battery in parallel with the AC source and the test battery, and c) determining the impedance of the test battery by comparing the profiles of the applied alternating current and of the resulting voltage.

Such a circuit arrangement and such a method as noted above are known from WO 2012/088555 A1. The impedance is an important property of a battery and can be used to determine the state of health of the battery, for example. In the known circuit arrangement, an AC source is connected to test connections to which a test battery can be connected. The circuit arrangement additionally has a voltmeter for measuring the resulting voltage profile between the test connections.

It is known that an alternating current applied to the poles of a battery generates a modulated voltage response, with the result that the impedance of the battery can be determined by means of a comparison, in particular by means of complex division. In practice, this is generally effected by determining the phase shift between the applied current and the resulting voltage signal and dividing their real amplitudes. For a more detailed characterization of the battery, measurements are usually carried out at different current or voltage frequencies and/or with more complicated excitation signals which differ from pure sinusoidal excitations, in which case the entire range of spectroscopic techniques is available to a person skilled in the art. Therefore, this is also referred to as impedance spectroscopy in this context.

The voltage profile recorded with the voltmeter is composed of a temporally constant DC component, namely the open-circuit voltage of the test battery, and an AC component which temporally varies on the basis of the alternating current applied. The parameters relevant to the determination of the impedance, such as the phase information, are able to be determined only from the AC component. At the same time, however, an exact determination of the AC component is made more difficult by the concomitant recording of the DC component which is large in comparison with the AC component, since it fills virtually the entire resolution range of the voltmeter.

The object of the present invention is to develop a circuit arrangement of the generic type in such a manner that the AC component contained in the voltage profile can be recorded with higher resolution.

This and other objects are achieved in accordance with the invention by virtue of the fact that the voltage recording device includes:

a voltage measuring unit for measuring a voltage profile between two measurement connections of the voltage measuring unit, and a compensation voltage source which is connected in series with the voltage measuring unit, provides a DC voltage and has a first pole of the first polarity and a second pole of the second polarity, wherein the first pole of the compensation voltage source is connected to the first test connection, the second pole of the compensation voltage source is connected to the first measurement connection, and the second measurement connection is connected to the second test connection.

The object is also achieved in accordance with the invention by virtue of the fact that the voltage recording device includes:

a voltage measuring unit for measuring a voltage profile between two measurement connections of the voltage measuring unit, and a compensation voltage source which is connected in series with the voltage measuring unit, provides a DC voltage and has a first pole of the first polarity and a second pole of the second polarity, wherein the first pole of the compensation voltage source is connected to the first test battery pole, the second pole of the compensation voltage source is connected to the first measurement connection, and the second measurement connection is connected to the second test battery pole, with the result that, when recording the profile of the resulting voltage, its DC component is at least partially compensated for by the DC voltage from the compensation voltage source.

According to the invention, a DC counter-voltage which compensates for a corresponding DC component of the original measurement voltage is therefore connected in opposition to the original measurement voltage. In other words, the DC voltage offset of the original measurement voltage is eliminated, with the result that the resulting measurement voltage only consists of the AC component enforced by the alternating current being impressed and—in the event of incomplete compensation—a reduced residual amount of the DC component. The latter can be reduced completely to zero by adjusting the compensation voltage to the open-circuit voltage of the test battery.

The alternating current which is responsible for producing the AC component and is applied to the test battery can be different. For this purpose, a sinusoidal alternating current of a particular frequency can be used, for example. However, in connection with impedance spectroscopy, a person skilled in the art is also aware of a number of further possibilities. For example, the alternating current need not necessarily be sinusoidal. It is only important that the impedance of the test battery can be determined from the alternating current profile and the measured voltage profile. The alternating current profile can be measured, for example, using a current measuring unit connected in series between one of the test connections and the AC source. Alternatively, however, it goes without saying that it is also possible to read the alternating current profile directly from the AC source or from a control unit controlling the AC source.

One preferred embodiment of the invention provides for the DC voltage provided by the compensation voltage source to be equal to the open-circuit voltage of the battery within a predefined tolerance. This makes it possible to advantageously virtually completely compensate for the open-circuit voltage of the test battery and therefore to determine the AC component of the voltage profile with an extremely high resolution and therefore extremely accurately.

Another embodiment of the circuit arrangement according to the invention provides for the compensation voltage source to be in the form of a controllable DC voltage source. This embodiment makes it possible to advantageously use the circuit arrangement for test batteries having different open-circuit voltages. It is therefore not necessary to exchange the compensation voltage source in order to determine the impedance of a second test battery. For example, before the alternating current is applied, the open-circuit voltage of the test battery can be measured and a corresponding counter-voltage can be controlled at the controllable compensation voltage source.

In other words, a method is considered to be advantageous in which use is made of a controllable compensation voltage source which is controlled in such a manner that, before the profile of the voltage resulting from the alternating current applied to the test battery is recorded, it provides a DC voltage which is equal to the open-circuit voltage of the test battery within a predefined tolerance. The controllable compensation voltage source may be implemented, for example, in the form of a digital/analog converter which provides a corresponding DC voltage on the basis of a setting which has been made.

Another preferred embodiment of the circuit arrangement according to the invention provides for the compensation voltage source to be a battery or a capacitor. The use of a capacitor is advantageous, in particular, since it is an extremely cost-effective compensation voltage source. In contrast, the disadvantage is that the capacitor is discharged relatively quickly again after a charging operation on account of leakage currents. Alternatively, provision is therefore made for the compensation voltage source to be a battery. Although the use of a battery is considerably more cost-intensive and less flexible than the capacitor, leakage currents have a lesser effect on the compensation voltage generated in contrast to the capacitor. A person skilled in the art can therefore adapt the circuit arrangement to the respective requirements through the selection of the compensation voltage source.

In the case of embodiments with a capacitor or a battery as the compensation voltage source, provision is particularly preferably made for the voltage recording device to also have a switch which bridges the voltage measuring unit. This makes it possible to very exactly set the DC voltage provided by the compensation voltage source to the open-circuit voltage of the test battery before the alternating current is applied, as provided for in another embodiment of the method according to the invention. This is done by first of all closing the switch and then opening it again in order to apply the alternating current to the test battery and record the voltage profile. As a result of the switch being closed, the test battery itself is used to charge the capacitor and to adapt the voltage of the compensation battery.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
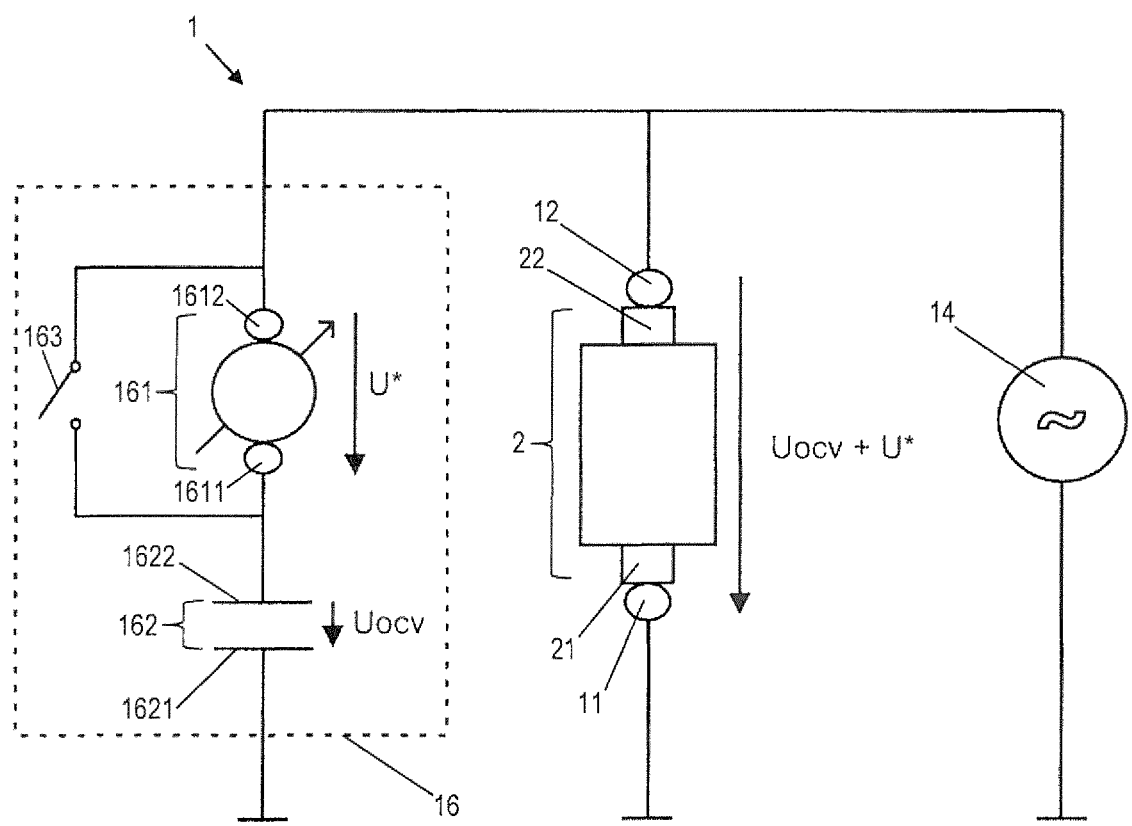
FIG. 1 is a first embodiment of a circuit arrangement according to the invention having a connected test battery.

An exemplary embodiment of a circuit arrangement according to the invention having a first test connection 11 and a second test connection 12 can be seen in FIG. 1. A first test battery pole 21 is connected to the first test connection 11 and a second test battery pole 22 of a test battery 2 is connected to the second test connection. FIG. 1 also illustrates an AC source 14 which is connected to the test connections 11, 12 and a voltage recording device 16 which is connected in parallel with the test connections 11, 12 and the AC source 14. The voltage recording device 16 has a voltage measuring unit 161 and a compensation voltage source 162.

In the exemplary embodiment illustrated in FIG. 1, the compensation voltage source 162 is in the form of a capacitor having a first pole 1621 and a second pole 1622. The voltage recording device 16 additionally has a switch 163 which bridges the voltage measuring unit 161. It can also be seen in FIG. 1 that the first pole 1621 of the compensation voltage source 162 is connected to the first test connection 11 via ground. The second pole 1622 of the compensation voltage source 162 is connected to a first measurement connection 1611 of the voltage measuring unit 161. And, the second measurement connection 1612 of the voltage measuring unit 161 is connected to the second test connection 12.

FIG. 1 likewise illustrates that a voltage corresponding to the open-circuit voltage $U_{OCV}$ of the test battery 2 is applied to the compensation voltage source 162. For this purpose, after the test battery 2 has been connected to the test connections 11, 12, the switch 163 is closed. Before an alternating current is applied to the test battery 2 by the AC source 14, the switch 163 is then opened again. As a result, a voltage consisting of the open-circuit voltage $U_{OCV}$ of the test battery and an AC component $U^*$ which temporally varies on the basis of the alternating current applied is therefore present between the test connections 11, 12, the profile of which voltage is recorded by the voltage recording device. The compensation voltage source 162 compensates for the DC component $U_{OCV}$ of the voltage profile recorded by the voltage recording device, with the result that the voltage profile measured between the measurement connections 1611 and 1612 contains only the AC component $U^*$. As a result, the AC component $U^*$ relevant to the determination of the impedance can be measured by the voltage measuring unit 161 with a high degree of accuracy and can be linked to the alternating current profile, by means of an impedance determination unit (not illustrated) connected to the voltage recording unit, to form an impedance value. For this purpose, the impedance determination unit controls the AC source 14, such that the alternating current profile applied to the test battery 2 is already stored in the impedance determination unit.

Figure 2:
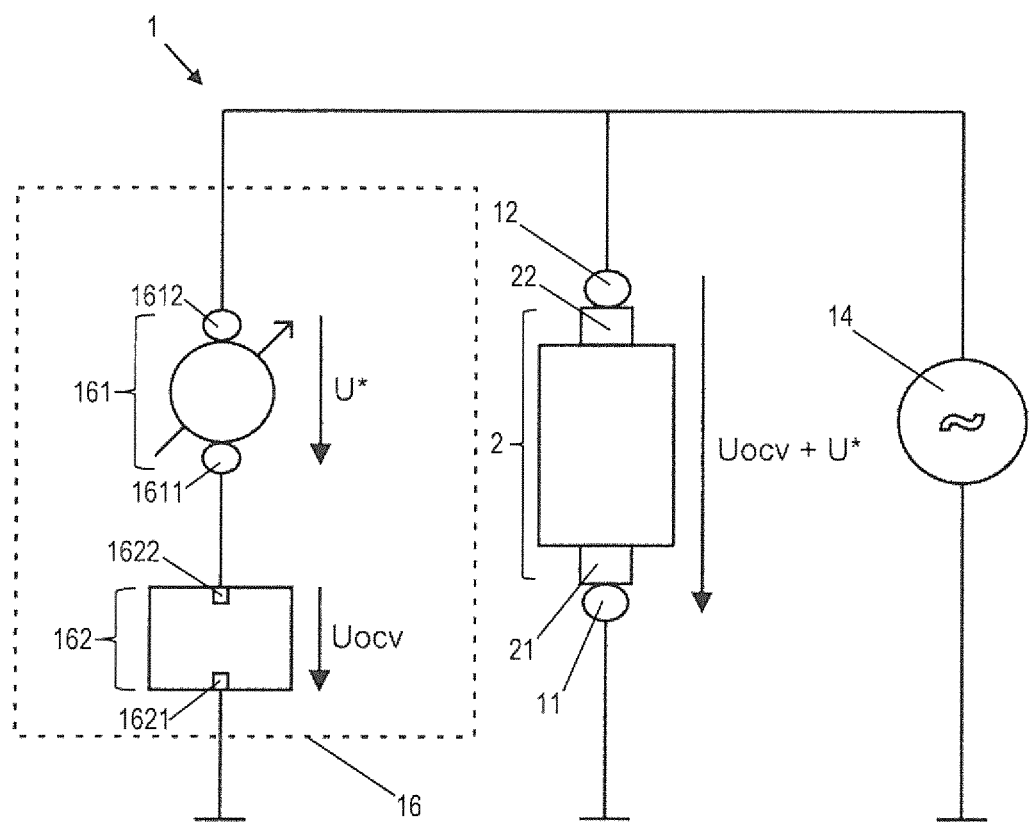
FIG. 2 is a second embodiment of a circuit arrangement according to the invention having a connected test battery.

FIG. 2 shows another exemplary embodiment of a circuit arrangement according to the invention, in which the compensation voltage source 162 is a controllable DC voltage source in the form of a digital/analog converter, as a result of which the DC voltage provided by the compensation voltage source 162 and applied between its first and second poles can be accordingly adjusted. In the exemplary embodiment shown in FIG. 2, the voltage provided by the compensation voltage source 162 is set exactly to the open-circuit voltage of the test battery 2, as a result of which, as already explained in the description for FIG. 1, the AC component of the voltage profile recorded at the voltage recording device, which AC component is produced by applying an alternating current to the test battery, can be measured by the voltage measuring unit with a high degree of accuracy. The measured AC component of the voltage profile is then transmitted to an impedance determination unit (not illustrated) which determines an impedance for the test battery 2 from the transmitted voltage profile and the alternating current profile. In the exemplary embodiment shown in FIG. 2, the alternating current profile is recorded by a current measuring unit (not illustrated) connected in series between the AC source 14 and the second test connection 22 and is transmitted to the impedance determination unit.

The embodiments discussed in the specific description and shown in the figures are naturally only illustrative exemplary embodiments of the present invention. In the light of the present disclosure, a person skilled in the art is provided with a wide range of possible variations.

LIST OF REFERENCE SYMBOLS

1 Circuit arrangement
2 Test battery
21 First test battery pole
22 Second test battery pole
11 First test connection
12 Second test connection
14 AC source
16 Voltage recording device
161 Voltage measuring unit
1611 First measurement connection of the voltage measuring unit
1612 Second measurement connection of the voltage measuring unit
162 Compensation voltage source
1621 First pole of the compensation voltage source
1622 Second pole of the compensation voltage source
163 Switch The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A circuit arrangement for determining impedance of a test battery having a first test battery pole of a first polarity and a second test battery pole of a second polarity, the circuit arrangement comprising:
   a first test connection for connecting the first test battery pole and a second test connection for connecting the second test battery pole;
   an AC source which is connected to the first and second test connections and is used to apply an alternating current to the test battery in a connected state;
   a voltage recording device which is connected in parallel with the test connections and the AC source and is used to record a voltage profile between the test connections, wherein the voltage recording device comprises:
      a voltage measuring unit for measuring a voltage profile between two measurement connections of the voltage measuring unit,
      a compensation voltage source which is connected in series with the voltage measuring unit, provides a DC voltage and has a first pole of the first polarity and a second pole of the second polarity, and
      a switch which bridges the voltage measuring unit,
      wherein the first pole of the compensation voltage source is connected to the first test connection, the second pole of the compensation voltage source is connected to the first measurement connection, and the second measurement connection is connected to the second test connection.

2. The circuit arrangement as claimed in claim 1, wherein the DC voltage provided by the compensation voltage source is equal to an open-circuit voltage of the test battery within a predefined tolerance.

3. The circuit arrangement as claimed in claim 1, wherein the compensation voltage source is a controllable DC voltage source.

4. The circuit arrangement as claimed in claim 1, wherein the compensation voltage source comprises a battery or a capacitor.

5. A method for determining impedance of a test battery having a first test battery pole of a first polarity and a second test battery pole of a second polarity, the method comprising the steps of:
   a) applying an alternating current to the test battery by an AC source connected to the test battery poles of the test battery, with the result that an accordingly modulated voltage results at the test battery poles;
   b) recording a profile of the resulting voltage by a voltage recording device which is connected to the test battery poles of the test battery in parallel with the AC source and the test battery;
   c) determining the impedance of the test battery by comparing the profiles of the applied alternating current and of the resulting voltage,
   wherein the voltage recording device comprises:
      a voltage measuring unit for measuring a voltage profile between two measurement connections of the voltage measuring unit,
      a compensation voltage source which is connected in series with the voltage measuring unit, provides a DC voltage and has a first pole of the first polarity and a second pole of the second polarity, and
      a switch which bridges the voltage measuring unit,
      wherein the first pole of the compensation voltage source is connected to the first test battery pole, the second pole of the compensation voltage source is connected to the first measurement connection, and the second measurement connection is connected to the second test battery pole, with the result that, when recording the profile of the resulting voltage, its DC component is at least partially compensated for by the DC voltage from the compensation voltage source.

6. The method as claimed in claim 5, wherein the compensation voltage source is a controllable DC voltage source and, before recording the profile of the resulting voltage, is controlled to provide a DC voltage which is equal to an open-circuit voltage of the test battery within a predefined tolerance.

7. The method as claimed in claim 5, wherein the compensation voltage source comprises a battery or a capacitor, and wherein the switch is first of all closed, before the alternating current is applied, in order to set the DC voltage provided by the compensation voltage source to an open-circuit voltage of the test battery within a predefined tolerance and is then opened again, before the alternating current is applied to the test battery, for recording the profile of the resulting voltage.

* * * * *